United States Patent
Huitema

(10) Patent No.: US 9,818,770 B2
(45) Date of Patent: Nov. 14, 2017

(54) FLEXIBLE MICRO-ELECTRONICS CIRCUITS WITH CRACK MITIGATION

(71) Applicant: FLEXTERRA, INC., Skokie, IL (US)

(72) Inventor: Hjalmar Edzer Ayco Huitema, Belmont, CA (US)

(73) Assignee: FLEXTERRA, INC., Skokie, IL (US)

( * ) Notice: Subject to any disclaimer, the term of this patent is extended or adjusted under 35 U.S.C. 154(b) by 0 days.

(21) Appl. No.: 15/235,077

(22) Filed: Aug. 11, 2016

(65) Prior Publication Data

US 2017/0098668 A1 Apr. 6, 2017

Related U.S. Application Data

(60) Provisional application No. 62/203,669, filed on Aug. 11, 2015.

(51) Int. Cl.
*H01L 27/12* (2006.01)
*H01L 27/32* (2006.01)
(Continued)

(52) U.S. Cl.
CPC .... *H01L 27/1244* (2013.01); *G02F 1/133305* (2013.01); *G02F 1/136286* (2013.01);
(Continued)

(58) Field of Classification Search
CPC ............. H01L 27/1244; H01L 27/1218; H01L 27/3288; H01L 27/3276; H01L 51/0097; H01L 2251/5338; G02F 1/13286; G02F 1/13305; G02F 2001/13695; G02F 2001/1676; G06F 1/163; G06F 1/167; G04G 21/08; G04G 17/045
See application file for complete search history.

(56) References Cited

U.S. PATENT DOCUMENTS

2002/0084460 A1* 7/2002 Takizawa ............... G02F 1/1345
257/72
2006/0071919 A1* 4/2006 Huitema ............. G02F 1/13452
345/204
(Continued)

*Primary Examiner* — Adrian S Wilson
(74) *Attorney, Agent, or Firm* — Marshall, Gerstein & Borun LLP

(57) ABSTRACT

An electronic circuit device that includes a plurality of electrical circuits disposed on a support substrate, such as an electronic display device, includes one or more primary electrodes that extend along a trace on the support substrate, wherein the primary electrodes form one or more primary electrical pathways of or to one or more of the electrical circuits. One or more secondary electrodes are disposed along and in electrical contact with the primary electrodes. The secondary electrodes extend along the trace substantially parallel with the primary electrodes and form secondary electrical pathways adjacent the primary electrical pathways. The secondary electrodes are formed of a secondary conductor that is electrically conductive and has a higher strain limit than the primary electrodes. The secondary electrodes are able to handle a higher amount of strain than the primary electrode without breaking the secondary electrical pathway and thereby are arranged to complete the electrical circuits when a gap in a primary electrode interrupts the electrical circuit through the primary electrode.

20 Claims, 9 Drawing Sheets

(51) Int. Cl.
*H01L 51/00* (2006.01)
*G02F 1/1362* (2006.01)
*G02F 1/1333* (2006.01)
*G06F 1/16* (2006.01)
*G02F 1/167* (2006.01)
*G04G 21/08* (2010.01)
*G04G 17/04* (2006.01)

(52) U.S. Cl.
CPC ........... *G02F 1/167* (2013.01); *G04G 17/045* (2013.01); *G04G 21/08* (2013.01); *G06F 1/163* (2013.01); *H01L 27/1218* (2013.01); *H01L 27/3276* (2013.01); *H01L 27/3288* (2013.01); *H01L 51/0097* (2013.01); *G02F 2001/136295* (2013.01); *G02F 2001/1676* (2013.01); *H01L 2251/5338* (2013.01)

(56) References Cited

U.S. PATENT DOCUMENTS

2010/0171683 A1* 7/2010 Huitema ............. G02F 1/13452
345/55
2011/0109654 A1* 5/2011 Van Veenendaal ....... G02F 1/133305
345/690

* cited by examiner

FLEXIBLE MICRO-ELECTRONICS CIRCUITS WITH CRACK MITIGATION

CROSS REFERENCE TO RELATED APPLICATIONS

This application claims priority to and the benefit of U.S. Provisional Patent Application Ser. No. 62/203,669, filed on Aug. 11, 2015, the disclosure of which is incorporated by reference herein in its entirety.

FIELD OF THE DISCLOSURE

The present disclosure is related generally to flexible micro-electronics circuits, and more particularly, to flexible micro-electronics circuits having a secondary conductor formed of one or more conductive materials with high strain limits that can bridge gaps in a primary conductor caused by strain cracks or other undesirable gaps formed in the primary conductor to mitigate detrimental effects of such gaps to the functionality of the circuit.

BACKGROUND

Micro-electronic circuit components for most portable electronic items, such as integrated circuits and electronic displays, are commonly installed within flat, hard surfaces of electronic devices, such as a rigid IC substrate or "chip", computer screens, television sets, smart phones, tablet computers, etc., and in many cases are installed on accessories for the electronic devices, such as removable monitors. Many electronic devices having an electronic display or other micro-electronic circuit are portable, and have thus become very useful in implementing mobile applications. This fact is particularly true with smart phones which have become ubiquitous. However, typical mobile devices such as smart phones have electronic displays that are rigid (and in some cases, flat) in nature. Thus, while these displays are useful in implementing many different applications, the device on which the display is present must still typically be held in a hand, or must be stored in a pocket, a purse, a briefcase or other container, which makes the electronic device less accessible in many situations, such as when a person is carrying other items, undertaking an athletic activity such as running, walking, etc. Moreover, in many cases these traditional electronic devices require two free hands to hold and operate, making these devices cumbersome or difficult to use or to view in situations in which, for example, a person has only one or no free hands or is otherwise occupied.

Flexible micro-electronics circuits, such as displays, are generally known and are starting to come into more common usage. However, flexible displays have not been widely incorporated into easily portable items such as items of clothing, wristbands, jewelry, etc. or on items that are easily attached to other items, much less in a manner that makes the display more useable and visible to the user in many different scenarios. Flexible displays are often thin sheet-like, band-like, or web-like structures, having a comparatively small thickness or height relative to a length and a width, and formed of one or more substrates, layers, and/or plies.

Dynamically flexible displays are also known. A dynamically flexible display is a type of flexible display that is adapted to be flexed, bent, shaped, and re-flexed and re-shaped multiple times. The terms "dynamic bending," "dynamic flexibility," "dynamically flexible," and similar terms, for example, generally refer to the ability to bend the attachable article, and more particularly the flexible electronic component, at a number of different points, if not every point, along a length of the flexible component, the ability to bend different portions of the attachable article differently (e.g., different portions can be bent at/to different angles or curvatures), the ability to bend the attachable article in a number of different directions (e.g., in a concave direction and a convex direction), and/or the ability to bend the attachable article in some other dynamic manner. Further, dynamically flexible may refer to the ability to repeatedly bend (i.e., multiple times) in different manners and directions, for example, so to as be selectively formable and re-formable to various different shapes by a user, without damaging the intended operable usability of the article, such as would be usual and customary when used as a wrist band, belt, item of clothing, and the like.

As illustrated in FIG. 1. a typical flexible display has three main components: namely, an electro-optic display panel 20, a rear substrate 21 disposed on the rear side of the electro-optic display panel 20, for example to support the electro-optic display panel 20, and a front substrate 24, which may include an optional touch sensor 25 and adhesive layer 26, disposed on the front side of the electro-optic display and through which the electro-optic display panel is visible. The flexible display may optionally have a flexible support substrate including foam layers 22 and adhesive layers 23 disposed on a rear side of the rear substrate. As used herein, the "front" side of the display panel 20 is the side that produces changeable optical images intended to be seen by a viewer, and the "rear" or "back" side of the display panel is the opposite side, which typically is not designed to display any particular images to be seen by the user.

FIG. 2 illustrates a detailed cross-section of an exemplary stack of layers of a typical flexible display (hereinafter, also called a "display stack"). The electro-optic display panel 20 includes an electo-optic medium 20a and an electrode matrix 20b secured to a rear side of the electro-optic medium 20a. Typical electro-optic mediums include liquid crystal displays (LCDs), cholesteric texture liquid crystal (CTLC) displays, Polymer-dispersed liquid crystals (PDLC) display, E-Ink® displays, electrophoretic displays, and electrowetting displays. The electro-optic medium 20a creates and displays changeable visual information, which is visible on the front side of the electro-optic display panel 20, in response to electronic command signals received through the electrode matrix 20b. The terms "front" and "rear" are used throughout with reference to the front side and the rear side of the electro-optic display panel 20. The front substrate 24 and all the layers on top, i.e., everything on top of the electro-optic medium 20a (as depicted in FIG. 2), are simply called the "top substrate" 27. In this example, the top substrate 27 includes the front substrate 24 disposed against the front side of the electro-optic medium, a moisture barrier 28 disposed against the front side of the front substrate 24, an adhesive layer 26 disposed against the front side of the moisture barrier 28, and a touch sensor 25 disposed against the front side of the adhesive layer 26. Preferably, another optically clear adhesive layer is disposed between the electro-optic medium 20a and the moisture barrier 28 to adhere moisture barrier 28 to the electro optic medium 20a. The rear substrate 21 here is also called the "bottom substrate" 21 and is typically made of a single layer that holds the matrix electrodes and other electronic elements. This layer may be flexible enough to allow a desired flexibility of the overall flexible display while being resilient enough to provide support and/or protection for the electro-optic display panel 20. The bottom substrate 21 may not be the bottom-most layer, however. Rather, a flexible support substrate may be attached to the rear side of the bottom substrate 21, including a foam layer 22 and an adhesive layer 23. The adhesive layer 23 is disposed against the rear side of the bottom substrate 21 and the foam layer 22 is disposed against the rear side of the adhesive layer 23. The foam layer 22 is a relatively thick layer of foam having visco-elastic properties and a very low stiffness when flexed slowly that increases when the foam is indented with high speed. This feature results in the foam layer 22 not affecting the flexibility of the display to any significant respect, but at the same time protects the display from impact by effectively spreading an impact over a larger area.

FIGS. 3A-3C illustrate a diagrammatic and schematic overview of a typical active-matrix thin film transistor (TFT) liquid crystal display (LCD) 30. In this example, the LCD includes an ITO (indium tin oxide) circuit on glass and a color filter array forming a top layer 31, an array of ITO electrodes and switches on glass forming a bottom layer 32, and a liquid crystal 33 disposed between the top layer 31 and the bottom layer 32. FIG. 3B illustrates an enlarged detail view of the bottom layer 32, which forms an active matrix circuit. FIG. 3C illustrates an electrical schematic of a basic circuit of the pixel 36, including a switch 37 and a liquid crystal element 38, formed by the active matrix circuit for one pixel of the LCD 30. The active matrix circuit of the bottom layer 32 includes row (gate) electrodes 34 and column (source and/or drain) electrodes 35, which together form a grid with one row electrode 34 and one column electrode 35 connection per pixel 36 of the LCD 30. The row electrodes 34 are typically electrically isolated from the column electrodes 35 by a dielectric layer (not pictured) and are attached to opposite sides of a circuit element such as a switch, which may be a transistor, an inverter, or other circuit element, used to control or initiate light to be emitted from the display. For example, the row electrodes 34 may be disposed at a first level of a layer stack, the column electrodes 35 may be disposed at a second level of the layer stack, and the dielectric layer may be disposed between the first level and the second level to electrically separate the row electrodes 34 from the column electrodes 35, although other functionally equivalent arrangements are also common. The switch 37 of a particular pixel 36 is connected to and disposed electrically between the row electrode 34 and the column electrode 35 associated with that pixel. In this example, the switch 37 is a transistor with a gate connected to the row electrode 34 and a source and drain connected to the column electrode 35. However, other types of switches and specific circuit arrangements are possible. When appropriate drive signals, such as selected electrical currents or voltages are provided to each of the row electrode 34 and the column electrode 35 of a particular pixel, the switch 37 is energized or thrown, thereby activating the display element (e.g., the liquid crystal element 38) for that pixel 36. As can be readily understood, when one of the electrodes 34 or 35 is interrupted, for example by a crack, the electrical signal cannot be passed to other pixels connected to that electrode after the interruption, resulting in a partial line defect. Such a defect can impair or prevent functioning of the LCD 30.

FIGS. 4A-4E illustrate a layer by layer overview of a typical layer stack (a "TFT stack") 40 for a pixel 35 in a typical active-matrix LCD, such as the LCD 30. In this case the TFT stack 40 is a bottom-gate, bottom-contact transistor configuration (a "bottom gate bottom contact stack") without a storage capacitor per pixel. However, other layer stacks are also possible, such as a top contact stack, a top gate stack, and combinations thereof. In the layer stack 40, the gate electrode 34 is the first layer of the TFT and is disposed on a bottom substrate 41, such as glass, as seen in FIGS. 4A and 4B. Next, as shown in FIG. 4C, a dielectric layer 42 is disposed on the gate electrodes 34 and the bottom substrate 41. In FIG. 4D, the source-drain electrodes 35 and a pixel pad 43 are disposed on top of the dielectric layer 42. FIG. 4D shows a semiconductor layer 44 disposed on top of the source-drain electrodes 35, thereby forming the complete layer stack 40. In some cases additional layers are used, such as etch stop layers to stop etching of the top metal contacts on top of the semiconductor.

The metal lines defining the gate and/or column electrodes 34 and 35 typically will break in the same region (range) of strain as other brittle layers in an LCD stack, such as the layer stack 40. This breaking point is typically at around 1% strain, either tensile or compressive. However, this range can be somewhat larger when the electrodes 34 and 35 are patterned layers and/or when ductile metals are used, such as gold. Nevertheless, it is undesirable to strain the metal of the row and/or column electrodes 34 and 35 beyond its yield strength and into its plastic deformation region, because the strain is not reversible in that region.

Moreover, there are several scenarios where the strain limits of the layers can be reached such that undesirable cracking and/or formation of gaps in the electrodes 34 or 35 may occur. A first scenario occurs during bending of the entire display 30, in particular including bending of the bottom substrate 41, such as during dynamic bending, where this bending imposes a certain limit on the overall bending radius of the LCD 30. A second scenario, as shown schematically in FIG. 5, occurs during a relatively sudden impact on the display, during which the object impacting the display creates a spot where the individual layers of the layer stack 40 are stretched in only a small region of the overall LDC 30. FIG. 5 illustrates a schematic cross section of the LCD 30 when impacted by a spherical ball, for example. When the electro-optic medium of the display, such as the liquid crystal 33, is either a fluid or a polymer with fluidic pockets, capsules or a polymer network in a fluid (LCD, CTLC, PDLC, E Ink, electrophoretics, electrowetting), this medium will have a Young's modulus that is orders of magnitude lower than that of either plastic or glass, and therefore in general also has a much lower flexural rigidity than either plastic or glass.

For a flexible electronic display or other flexible electronics article including a layer stack 40 as outlined above, the preferred materials from which the electrodes 34 and 35 and other portions of the circuit are made (e.g. metals like Au, Ag, Cu, ITO, Mo, Al) are often brittle, i.e., have low ductility, and therefore are subject to cracking and breaking under strains developed, for example, when the electronics circuit undergoes dynamic bending or a sudden impact as described above. Such cracks can form gaps along the electrodes 34 and 35, for example on the order of 1 nanometer to 500 nanometers and even up to 1 μm, which can degrade or even prevent conduction of electrical current through the electrodes 34 and 35, and thereby degrading or preventing proper functioning of the circuit. Although more ductile conductors are known, which would be able to withstand more strain and/or sudden impact without developing such gaps, these conductors tend to have lower electrical conductivity and, therefore, are not preferred for use as the conductors 34 and 35 for reasons related to speed and efficiency (power usage) of the circuit. Thus, a limitation on the production and/or durability of a typical microelectronics circuit is the amount of strain that can be endured by the conductors 34 and 35 without degrading or preventing functioning of the circuit according to its intended capabilities.

SUMMARY

According to some aspects of the disclosure, an electronic circuit device includes a plurality of electrical circuits disposed on a support substrate. The support substrate may be a bottom substrate and may be rigid or dynamically flexible. At least one primary electrode extends along a trace on the bottom substrate, wherein the primary electrode forms a primary electrical pathway of at least one of the electrical circuits. A secondary electrode is disposed along and in electrical contact with the primary electrode. The secondary electrode extends along the trace substantially parallel with the primary electrode and forms a secondary electrical pathway adjacent the primary electrical pathway. The secondary electrode is formed of a secondary conductor that is electrically conductive and has a higher strain limit than the primary electrode. The secondary conductor may be made of a material that is able to withstand a higher amount of strain than the primary electrodes without negatively influencing the electrical conductivity substantially, including as non-limiting example, ductile materials and/or films with a random networks of conducting wires. The secondary electrode is arranged to complete the electrical circuit when a gap in the primary electrode, for example formed by a small crack, interrupts the electrical circuit through the primary electrode. The plurality of electrical circuits may, in some arrangements, form one or more pixels of an electronic display device. The electronic display device may optionally form or include a touch screen, wherein data may be input to an electrical processor by touching the visual display screen of the electronic display device.

According to some aspects of the disclosure, an electronic display device with a matrix of pixels carried by a bottom substrate includes at least one primary electrode for forming at least one primary electrical pathway of at least one electrical circuit associated with the pixels and a secondary conductor disposed along and in electrical contact with the primary electrode. The secondary electrode extends along the same trace as the primary electrode substantially parallel with the primary electrode and forms a secondary electrical pathway adjacent the primary electrical pathway. The secondary electrode is formed of a material that is electrically conductive and has a higher strain limit (e.g., a higher overall ductility and/or lower brittleness) than the primary electrode. The secondary electrode is located so as to complete the electrical circuit when a crack in the primary electrode interrupts the electrical circuit. Thus, if the primary electrode is interrupted by cracks or breaks that form relatively small gaps along the primary electrode, such as from strains caused by dynamic bending or sudden impacts, the secondary electrode can bridge these gaps to maintain the electrical functionality of the electrical circuits.

According to some aspects of the disclosure, a dynamically flexible display device may incorporate an electronic display device including any other aspects, arrangements, and/or features disclosed herein. In some arrangements, such a dynamically flexible display device may include a dynamically flexible support substrate, and the electronic display device may be carried by the flexible support substrate. The bottom substrate of the electronic display device, which may form the rear side of the electronic display device, i.e., the side opposite from the visual display side, may be dynamically flexible.

According to some aspects of the disclosure, a wrist band device may incorporate an electronic display device including any other aspects, arrangements, and/or features disclosed herein. In some arrangements, such a wrist band device may include a flexible band to be secured around a user's wrist. The electronic display device may be carried by the flexible band and disposed on an outer side of the flexible band. The bottom substrate of the electronic display device may be dynamically flexible. An electronics module may be carried by the flexible band, and the electronics module may control functioning of the electronic display device. Any one or more of the foregoing aspects and/or arrangements may optionally include any one or more of the following arrangements and/or features.

In some arrangements, the secondary electrode extends along the same path over the bottom substrate as the primary electrode, preferably immediately above or immediately below the primary electrode. The secondary electrodes may have the same shape and footprint on the substrate with sufficient portions of the primary electrodes to effectively functionally mimic the electrical circuit(s) formed by the primary electrodes. In other words, the secondary electrode may follow the same trace as all or portions of the primary electrode and/or the primary and the secondary electrode may be superimposed, one on top of the other. The secondary electrode may be disposed directly underneath the primary electrode and form a supporting layer for the primary electrode. That is, the secondary electrode may be disposed between the primary electrode and the bottom substrate. In some arrangements, the secondary electrode may form a covering layer for the primary electrode. Thus, the secondary electrode may be supported by the primary electrode. That is, the secondary electrodes may be disposed on top of and/or on one or both sides of the primary electrodes. In some arrangements, the secondary electrode may form a supporting layer for the primary electrode and may form a covering layer for the primary electrode. The secondary electrode may have the same width or a different width as the primary electrode on the substrate. The secondary electrode may for example be wider than or more narrow than the primary electrode on the substrate.

In some arrangements, the secondary electrodes may be in direct contact with or lie against the primary electrodes along a portion of the length of the primary electrodes or along the entire or substantially the entire length of the primary electrodes. The secondary electrodes may be physically separated, at least partly, from the primary electrodes, for example by an intervening layer of other material, while still being electrically coupled with the primary electrodes.

In some arrangements, the secondary conductor forming the secondary electrodes may be a material that is both electrically conductive and have a higher strain limit than the material forming the primary electrode. In various arrangements, the secondary conductor may include or be one or more high ductility metal conductors, such as gold, silver, copper, or other similar metal conductors. The secondary conductor may include or be formed of high strain limit films with silver nanowires and/or copper nanowires. The secondary conductor may include or be formed of high strain limit films with conductive additives, such as carbon nanotube films and/or silver nanotube films. The secondary conductor may include or be formed of a conductive organic polymer film with high strain limit, such as PeDot (poly(3, 4-ethylenedioxythiophene) polystyrene sulfonate). Other materials with higher strain limits than the primary electrode and with electrical conductivity sufficient for at least minimal usage in the electronic circuit may also be used for the secondary conductor.

In some arrangements, the secondary conductor may have a lower electrical conductivity than the primary electrodes. That is, the material forming the primary electrodes may have a higher electrical conductivity than the secondary conductor. The secondary conductor preferably has an electrical conductivity sufficient to allow the electronic circuit to function according to its intended use, although the conductivity may not provide for optimal functioning of the electrical circuit. However, the secondary conductor could have a higher conductivity than the primary electrodes.

In some arrangements, the electronic display device may be a visual display, a flexible display, and/or a dynamically flexible display. The electronic display device may include a liquid crystal display (LCD), a CTLC display, a PDLC display, an E-Ink display, an electrophoretics display, and/or an electrowetting display. The electronic display may be a thin-film-transistor LCD. The electronic display may be an active matrix LCD. The primary electrodes may form row electrodes and/or column electrodes associated with one or more rows and/or columns of a pixilated display. The primary electrodes may, for example, form gate electrodes and/or source electrodes. The primary electrodes may form a grid including at least one row electrode and at least one column electrode per pixel of the matrix of pixels.

In some arrangements, the primary electrodes may be arranged in two or more layers. For example, the primary electrodes may include a first layer and a second layer. The first layer of the primary electrodes may be disposed on top of the secondary electrodes. The second layer of the primary electrodes may be disposed above the first layer. Each of the first layer of the primary electrodes and the secondary electrodes may extend along a first trace. The second layer of the primary electrodes may extend along a second trace, which is different than the first trace. A dielectric layer may be disposed between the first and second layers of the primary electrodes along portions of the electrical circuit. The first layer of the primary electrodes may form both row electrodes and column electrodes. The first layer of the primary electrodes may form one or more row electrodes, and the second layer of the primary electrodes may form one or more column electrodes. Alternatively, the first layer of the primary electrodes may form one or more column electrodes, and the second layer of the primary electrodes may form one or more row electrodes. Likewise the secondary electrodes may be arranged in two or more layers. For example, the secondary electrodes may include a first layer and a second layer. The first layer of the primary electrodes may be disposed on top of the first layer of the secondary electrodes, and the second layer of the primary electrodes may be disposed on top of the second layer of the secondary electrodes. The first layer of the secondary electrode may be disposed on top of the first layer of the primary electrode, and the second layer of the secondary electrode may be disposed on top of the second layer of the primary electrode.

In some arrangements, the substrate is flexible. The substrate may be flexible so as to allow for dynamic flexing of the electronic display device. The substrate may be plastically deformable. However, the substrate need not be flexible.

Additional aspects, arrangements, and features in accordance with the present disclosure will be evident upon study of the drawings and the following descriptions thereof.

DETAILED DESCRIPTION OF THE DRAWINGS

Figure 1:
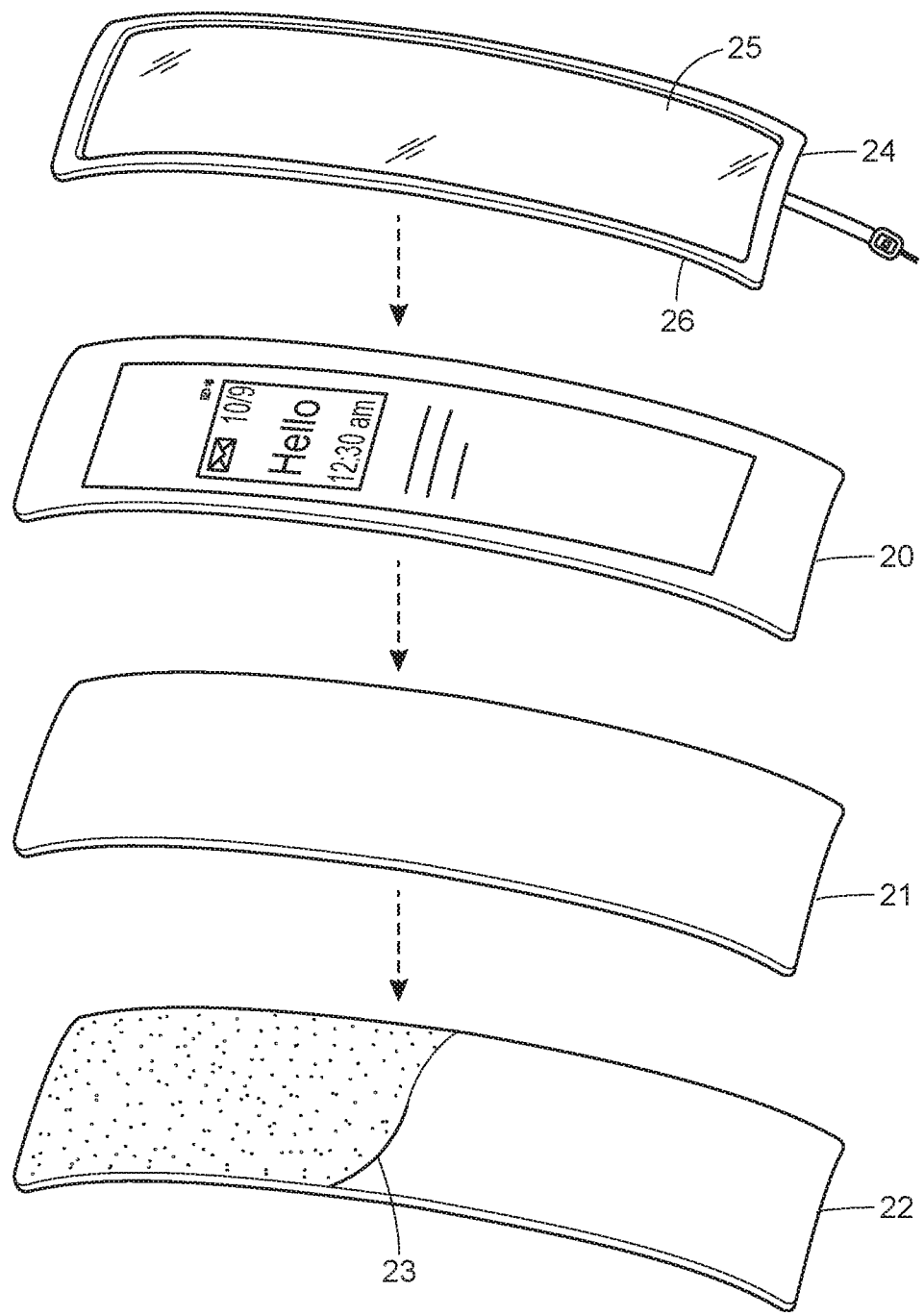
FIG. 1. illustrates typical components of a flexible electronic display.
Figure 2:
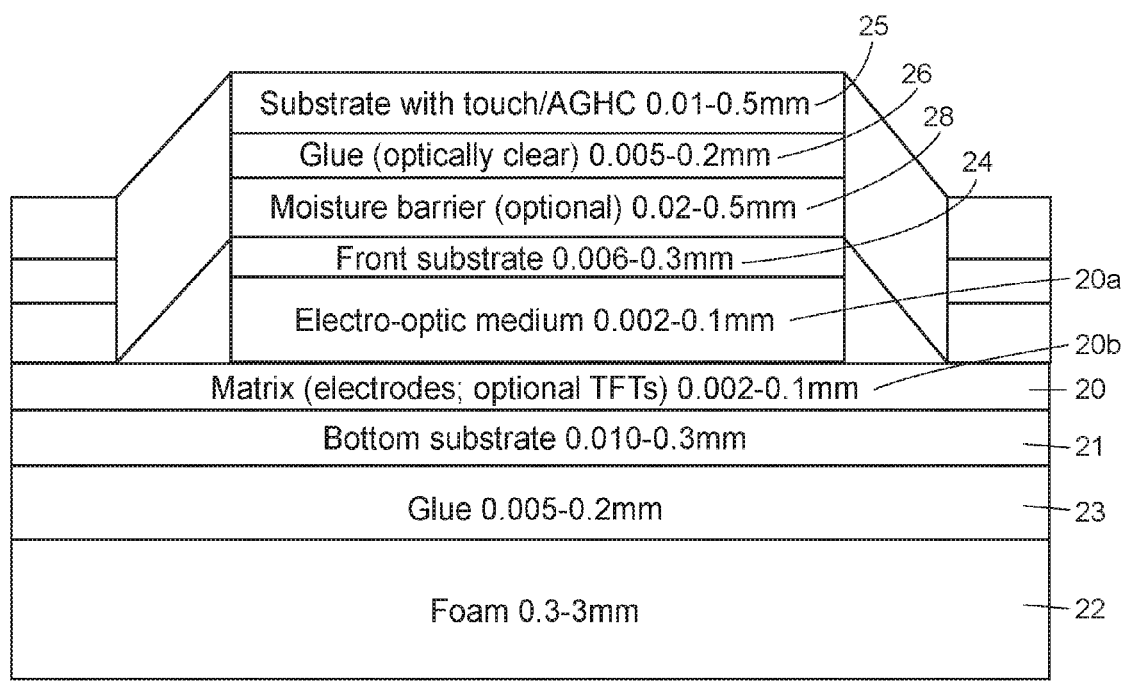
FIG. 2 is an enlarged partial cross-sectional view of a typical flexible electronic display.
Figure 3A:
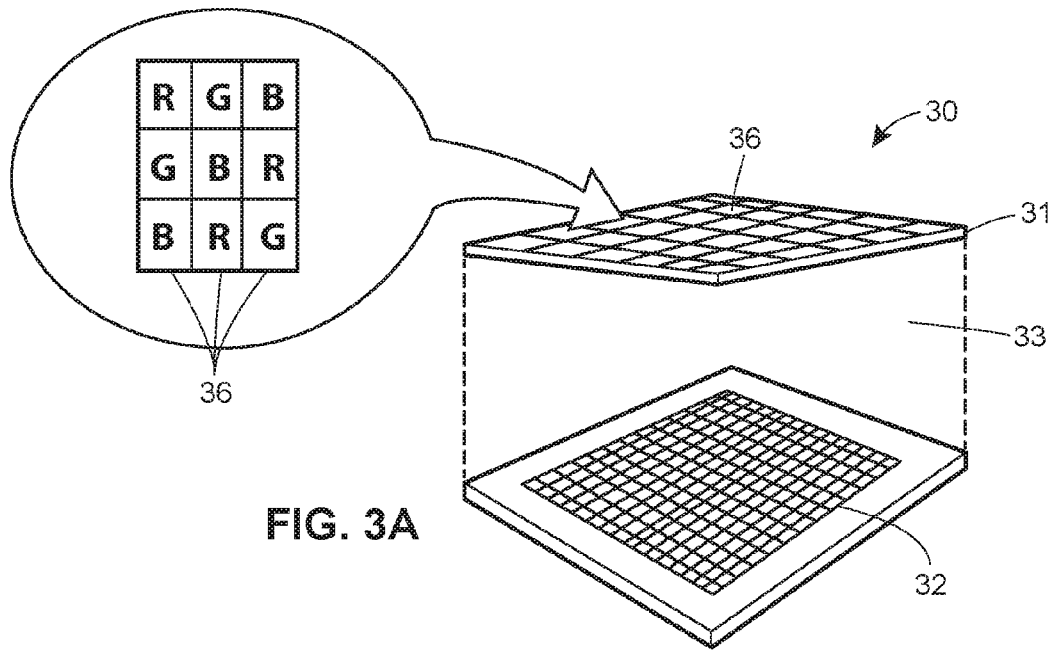
FIG. 3A is a diagrammatic illustration of a typical active-matrix LCD.
Figure 3B:
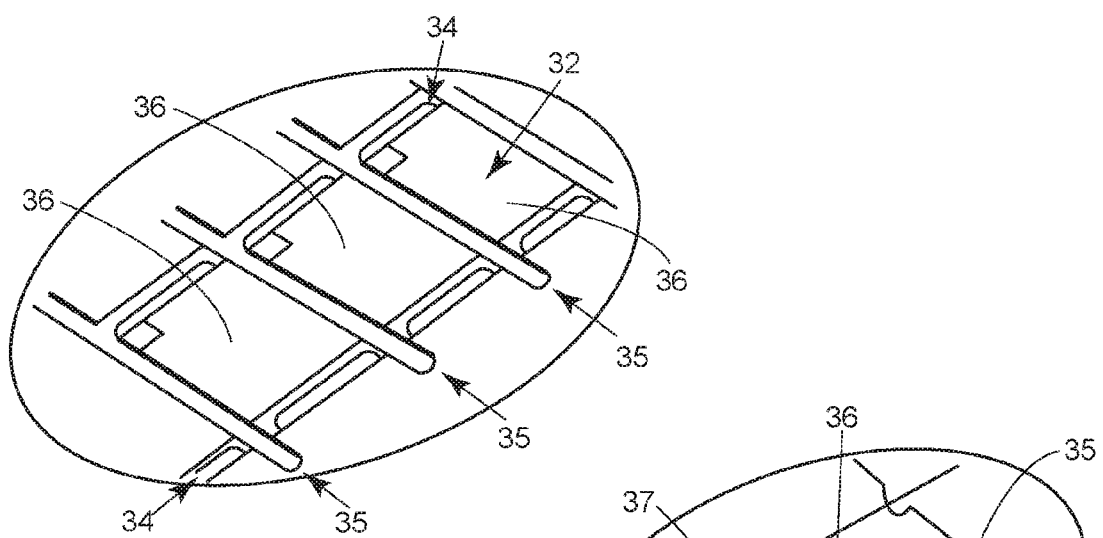
FIG. 3B is an enlarged diagrammatic illustration of pixels of the active-matrix LCD of FIG. 3A.
Figure 3C:
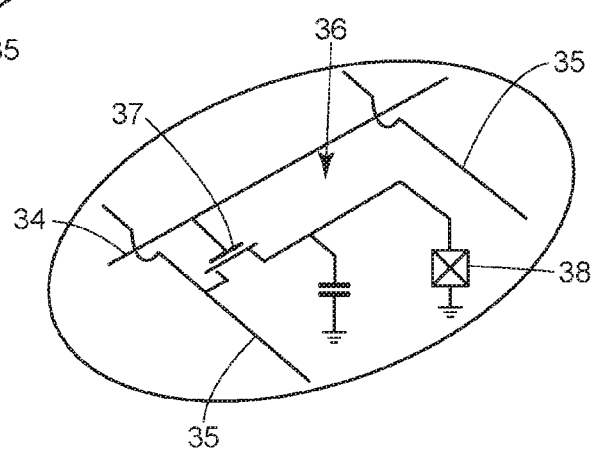
FIG. 3C is a schematic illustration of typical representative circuitry of a pixel of FIG. 3B.
Figure 4A:
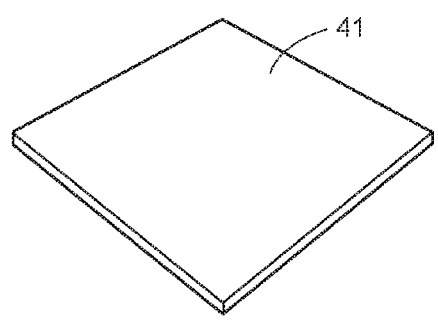
FIGS. 4A-4E are diagrammatic layer-by-layer overviews of a typical TFT stack for an LCD.
Figure 4B:
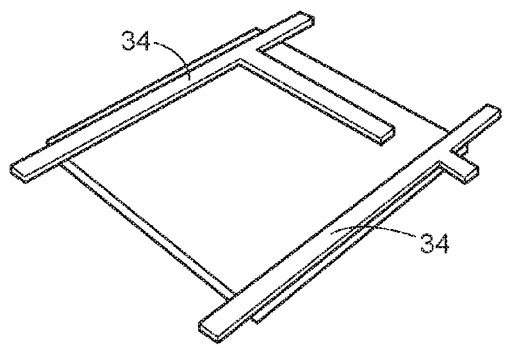
Figure 4C:
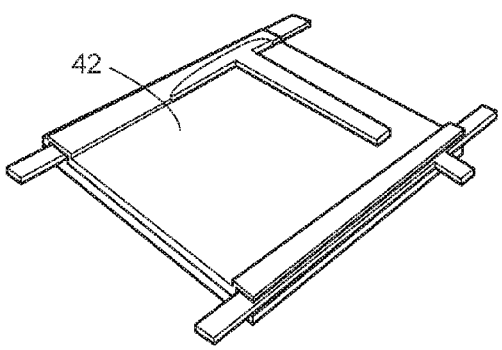
Figure 4D:
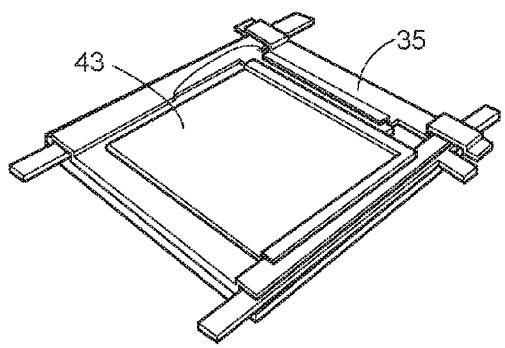
Figure 4E:
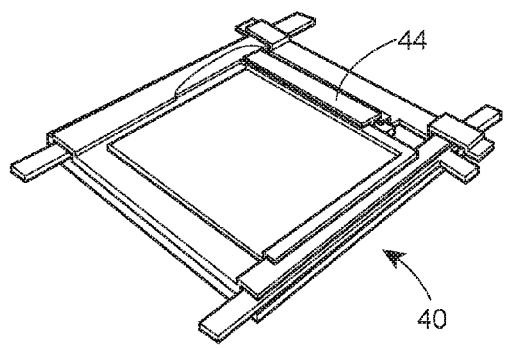
Figure 5:
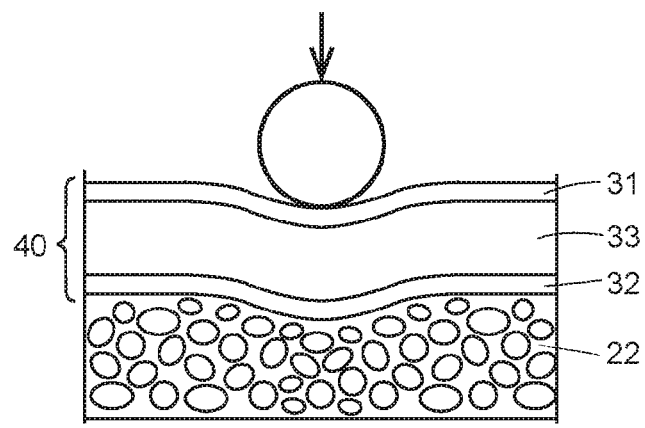
FIG. 5 is a diagrammatic cross-sectional illustration of an LCD stack being impacted by a ball.

In very general terms according to some aspects of the disclosure, a layer stack of an electronic circuit device, such as a layer stack of an electronic display, includes at least one primary electrode that extends along a path on a support substrate, such as a row and/or a column electrode layer, and at least one secondary electrode, such as a layer of conductive material that has a higher strain limit than the primary electrode and that extends along the same path on the support substrate as the primary electrodes, preferably directly above and/or below the primary electrode, such that the secondary electrode can bridge possible gaps, such as cracks, breaks, holes, deformations, splits, or other flaws in the primary electrode due to overstretching, too much compression, impacts, etc. The material of the secondary electrode is preferably able to handle a larger amount of strain than the material of the primary electrode (without cracking, buckling, or breaking), while the material of the secondary conductor does not need to have as high a conductivity as required for the primary electrode, because a crack in the primary electrode typically only creates a very small gap, for example, 1 nanometer (nm)-500 nm, that needs to be bridged. Typical materials that can be used for the secondary electrodes include, as a non-limiting list of examples, carbon nanotubes, silver nanowires, copper nanowires, and/or conductive organic polymers. In some arrangements, the secondary electrodes may be formed as a layer that is patterned by photolithography together with the patterning of the layer of the primary electrodes, or the secondary electrodes may be formed as a layer that is pre-patterned, for example, by using laser ablation. In this manner, a more robust display may be created where cracking of the primary electrodes will not lead to display failure.

The present disclosure is applicable to many different types of electronic circuit devices that include a plurality of electrical circuits disposed on a support substrate, wherein the support substrate provides sufficient form stability for supporting the electrical circuits so as to maintain their functionality, for example, where the support substrate is rigid, resiliently deformable, plastically deformable, and/or dynamically flexible. One or more primary electrodes extend along a trace on the support substrate, wherein the primary electrodes form one or more primary electrical pathways of or to one or more of the electrical circuits. One or more secondary electrodes are disposed along and in electrical contact with the primary electrodes. The secondary electrodes extend along the trace substantially parallel with the primary electrodes and form secondary electrical pathways adjacent the primary electrical pathways. The secondary electrodes are formed of a secondary conductor that is electrically conductive and has a higher strain limit than the primary electrodes. The secondary electrode may have a lower electrical conductivity than the primary electrode. The secondary electrodes are arranged to complete the electrical circuits when a crack in a primary electrode interrupts the electrical circuit through the primary electrode. Thus, although the remaining description is directed toward a specific exemplary application of such an electrical circuit device in the form a flexible electronic display device with pixels, the disclosure is not limited to these example applications.

Typically, more than one layer of primary electrodes is present in an integrated circuit, electronic display, or other similar micro-electronic article. One design in terms of additional layers is to add the secondary electrode(s) as a supporting conductive layer forming a first conducting layer supporting multiple primary electrode layers. The supporting conductive layer can be in direct contact with the first primary electrode layer or can be separated from the first primary electrode layer by a dielectric. In order to facilitate the electrical contact between the supporting conductive layer and any primary electrode layer, the possible layers between the supporting conductive layer and a primary electrode layer may be removed, at least locally, in order to form vias that facilitate electrical contact between the layers of the secondary and primary electrodes.

Preferably, the conductive layer that forms the secondary electrode is patterned into a similar shape as the primary electrode in order to avoid inducing leakage currents between the primary and secondary electrodes. This technique can be performed in a first patterning step separate from the patterning step for forming the primary electrode(s). Alternatively, this technique can be performed by patterning the conductive layer that forms the secondary electrode at the same time as the patterning of one of the layers that forms the primary electrode.

Figure 6:
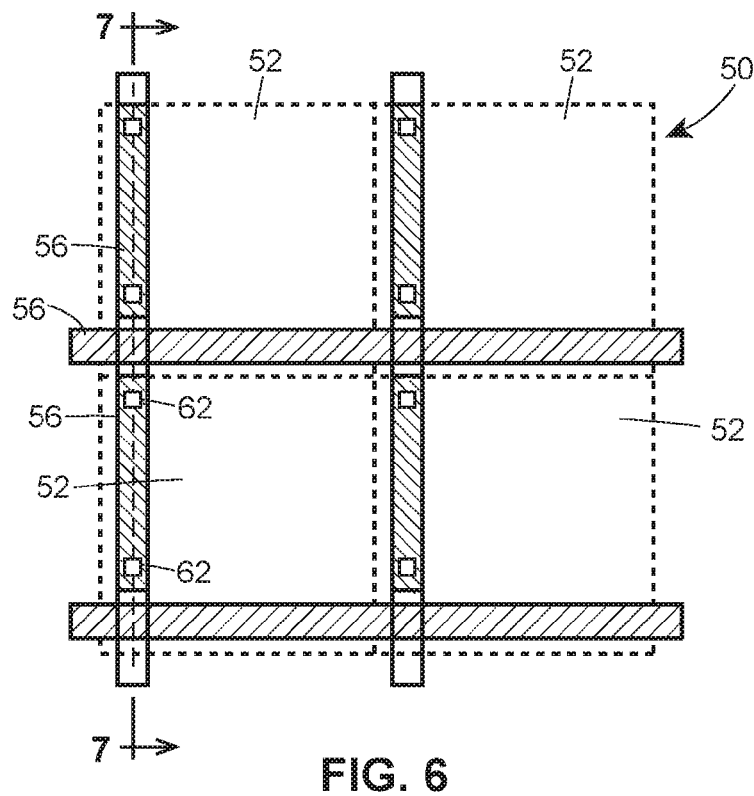
FIG. 6 is a diagrammatic top plan view of a portion of an electronic circuit device according to an aspect of the present disclosure.
Figure 7:
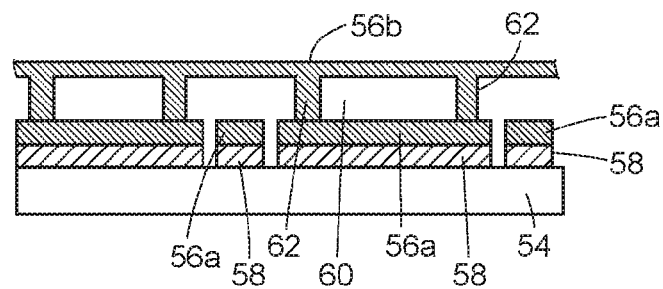
FIG. 7 is a diagrammatic cross-section view of the layer stack of the electronic circuit device along the lines 7-7 of FIG. 6.

Turning now to the specific examples of the drawings, FIGS. 6 and 7 illustrate a portion of an electronic display 50 exemplifying certain aspects of the disclosure. In this arrangement, the secondary electrodes 58 are in the form of a secondary conductor disposed underneath the primary electrodes 56 to form a supporting layer for the primary electrodes 56. The primary electrodes 56 may be formed in one, two, or more layers on top of a single layer of the secondary electrodes. The supporting layer of the secondary conductor is patterned at the same time (i.e. simultaneously) as the layer forming the primary electrodes. As a result, the primary electrodes 56 and the secondary electrodes 58 are formed having identical traces, one directly on top of the other, on the support substrate 54.

More particularly, a matrix of pixels 52 is carried by a support substrate 54. Each primary electrode 56 forms a primary electrical pathway of an electrical circuit with a corresponding pixel 52 of the display device. Each pixel 52 may include, for example, circuitry similar to the circuitry of the pixel 36 as described previously herein. The primary electrodes 56 are arranged as column electrodes and row electrodes extending across the top surface of the support substrate 54, such that the circuitry of each pixel 52 is coupled to one column electrode and one row electrode, for example, generally similar to the basic circuit of the pixel 36 described previously herein. In this example, the column electrodes form source and drain electrodes connected to the source and drain contacts of a transistor, and the row electrodes form gate electrodes connected to gate contacts of the transistor; however, other arrangements are also possible. The primary electrodes 56 have a trace that extends along and/or defines one or more paths along the top of the support substrate 54, which corresponds to the shape or footprint of the primary electrodes 56 on the support substrate 54. The primary electrodes 56 are preferably in the form of one or more layers of conductive material, which may be deposited on the layer stack forming the pixels 52 in any manner suitable for obtaining the desired functionality of the layer stack. In this arrangement, as best seen in FIG. 7, the primary electrodes 56 include a first, lower layer 56a and a second, upper layer 56b. The lower layer 56a of the primary electrode forms the row electrodes and portions of the column electrodes extending between the row electrodes. The upper layer 56b extends along the same paths as the column electrodes of the lower layer 56a and also bridges the intentional gaps between sections of the lower layer 56a of the column electrodes at the intersections with the row electrodes, in a manner well understood in the art. A dielectric layer 60 is disposed intermediate the upper layer 56b and the lower layer 56a of the column electrodes to electrically separate the upper and lower layers of the column electrodes. The dielectric layer 60 also electrically isolates the row electrodes from the column electrodes. Vias 62 that extend through the dielectric layer 62 to electrically connect the upper layer 56b and the lower layer 56a are located intermittently along the column electrodes so that the upper layer 56b of the primary electrodes bridges the intersections with the row electrodes formed by the lower layer 56a of the primary electrodes, in a manner well understood in the art. Of course, additional or fewer layers of the primary electrodes 56 are also possible, depending on the circuitry design. The primary electrodes 56 form the primary electrical pathways for providing power to the various electrical circuits of the individual the pixels 52, such as the circuits described previously herein, for operating the pixels 52 to display various information, in any manner understood in the art.

A secondary electrode 58 is disposed on the primary electrodes 56 and is electrically coupled to the primary electrodes 56, either indirectly through an intermediate layer or by direct contact against the primary electrodes 56. The secondary electrodes 58 are shaped so as to form a secondary electrical pathway that is able to bridge possible cracks and/or buckles in portions of the primary electrode 56. Preferably, the secondary electrodes 58 are in direct electrical contact with the primary electrodes 56 along substantially the entire lengths of at least some, and preferably as much as possible of the sections of the primary electrodes 56, such as the column electrodes and/or the row electrodes. In some arrangements, the secondary electrodes 58 are formed of a layer of ductile and/or higher strain limit, electrically conductive material applied, for example, to the substrate 54 and/or to other layers of a layer stack of the pixels 52, which layer may be deposited in any manner suitable for obtaining the desired functionality of the layer stack, and which is shaped, such as by ablation or etching, into the form of the secondary electrode 58. In this arrangement, the upper surface of the secondary electrode 58 is in direct contact against the lower layer 56a of the primary electrodes 56 along the entire length and path of the lower layer 56a. Further, the secondary electrodes 58 form or extend along the same paths as the lower layer 56a, thereby forming a functionally identical circuit path as the lower layer 56a of the primary electrodes immediately below the lower layer 56a. In this arrangement, the first layer 56a of the primary electrode 56 and the secondary electrode 58 extend along a first trace, and the second layer 56b of the primary electrode 56 extends along a second trace directly above the column electrodes, which is slightly different than the first trace because the second layer 56b bridges over the row electrodes.

The secondary electrodes 58 are made of an electrical conductor material that has a high strain limit and is able to deform, stretch, or compress sufficiently to handle a larger amount of strain than the primary electrodes 56. In other words, the secondary electrodes 58 are formed of a material that is less brittle than the material from which the primary electrodes 56 are formed, and therefore less susceptible to cracking, buckling, or other defect formation under loads. The secondary electrodes 58 are preferably made of a material that can deform sufficiently to bridge possible cracks in the primary electrodes 56 due to, for example strains caused by overstretching, such as a crack creating a gap in the primary electrode 56 on the order of 1-500 nm wide. Typical materials that can be used for this secondary conductive layer include carbon nanotubes, silver nanowires or copper nanowires, conductive organic polymers with high strain limit, and/or films comprising any of the same. Other materials may also be sufficient for forming the secondary electrodes 58 as long as they have the ductility and/or high strain limit and the electrical conductivity necessary to successfully bridge small cracks in the primary electrodes 56 as described herein and provide a sufficient electrical conductivity for driving operation of the pixels 52.

In some arrangements, the secondary electrode 58 can be, for example, a layer of secondary conductor material, which may be patterned by photolithography, either individually or together with patterning of the first layer of the primary electrodes 56. The layer of the secondary conductor material can be, for example, pre-patterned into the shape of the secondary electrode 58, that is, patterned prior to patterning of the first layer of the primary electrodes 56, by using laser ablation. However, other methods of creating the layer of the secondary electrode 58 may be used.

The conductivity of the secondary electrodes 58 may be less than the conductivity of the primary electrodes 56; however, the conductivity of the secondary electrodes 58 may optionally be the same or higher than the conductivity of the primary electrodes 56 in some arrangements. Because cracks in the primary electrodes 56 are typically on the order of 1-500 nm wide, the amount of length that needs to be overcome by the secondary electrode 58 to bridge any gaps by such cracks is relatively small. This fact generally results in conductivity requirements for the secondary electrodes 58 that are much lower than that of the primary electrodes 56 as the current traveling through the secondary electrode 58 when traveling around a gap or crack in the primary electrode 58 experiences only a small or short path within the higher resistance (less conductive) secondary electrode material. For example, a 6-inch 4:3 aspect ratio electronic display 50 with an electrode width of 5 microns, which is a typical size and design rule for an active-matrix display, results in an electrode length of around 12 and 9 cm for the primary row electrodes and the column electrodes. With an electrode resistance of 2 Ohm per square, this configuration results in 12 cm×1×10^4/5 um×2 Ohm/square=48 kOhm and 36 kOhm for the row electrodes and the column electrodes, respectively. When a crack in one of the primary electrodes 56 forms a gap 500 nm wide, and the resistance of the primary electrode 56 is only allowed to become 1% higher due to the crack, the requirement on the resistance of the supporting conductive layer is about 40 kOhm×1%×5 um/0.5 um=4 kOhm/square, assuming the layer trace of the secondary electrode 58 is also only 5 microns wide. This requirement is achievable by several extremely flexible conductive layers and is a resistance value that is more than three orders of magnitude higher than typically used for electrode metals used for the primary electrodes 56. Thus, even for larger electronic displays 50, where the primary electrodes could be up to 100 cm long with an electrode width of 10 microns wide and an electrode conductivity of 0.2 Ohm/square, the requirement on the secondary electrodes 58 would be still be 4 kOhm/square. Thus, a wider range of ductile and/or higher strain limit conductive materials may be available for use as the secondary electrodes 58, which may in some arrangements provide cost savings and/or ease of manufacture.

Preferably, the materials used to form the "wired" layers of the pixel stack, including the primary electrodes 56, the secondary electrodes 58, and the dielectric 60, are selected so that patterning of these layers can be performed by dry or wet etching with typical feature sizes up to 30 micron. Each of the materials described herein for this purpose is believed to be suitable to meet this specification. In addition, it is believed that all of the layers of the pixel stack can also be patterned by conventional photolithography using these materials.

FIGS. 6 and 7 illustrate one possible design in which the secondary electrodes 58 are formed as a supporting conductive layer for the primary electrodes 56, and in which the secondary electrodes 58 and the primary electrodes 56 form identical tracks on the substrate 54, i.e., have identical or nearly identical traces. In one method of forming this arrangement of the pixel stack, the secondary conductor 58 is deposited as a first layer onto the support substrate 54 using any suitable deposition technique. Next, the lower layer 56a of the primary electrode 56 is deposited as a second layer over the first layer of the secondary conductor 58. Thus, the first layer, i.e., the secondary conductor layer that will form the secondary electrode 58, forms a supporting layer for the second layer of material, which will form the first layer 56a of the primary electrodes 56. After both layers are deposited, the first layer and the second layer are both patterned at the same time to form the first layer into the secondary conductor 58 and the second layer into the primary electrode 56 along the exact same trace. Known etching techniques may be used for this purpose. After the patterning, a dielectric 60 is deposited over the first primary electrode layer 56a (and the secondary electrodes 58) and patterned such that there are via holes 62 extending to the first primary electrode layer 56a below. Thereafter, the second primary electrode layer 56b is deposited and structured on top of the dielectric 60. In this arrangement, any crack or buckle in the first layer 56a of primary electrodes 56 is supported and electrically bridged by the supporting layer of secondary conductor 58 (except for the second layer of the primary electrode 56b in crossing areas of the rows with the columns).

The secondary electrodes 58 are not limited to being the bottom-most layer in the pixel stack, but rather can be at any position in the pixel stack capable of acting as a secondary, or bypass route for the primary electrodes 56 in the case of an unintended gap caused by a crack or gap in the primary electrodes 56. For example, the secondary electrodes 58 may be on the bottom of the stack as shown in FIGS. 6 and 7, on top of the first primary electrode layer 56a, below the second primary electrode layer 56b, on top of the second primary electrode layer 56b, and so on. However, in general, it is believed that using the secondary electrodes 58 as the first conductive layer above the support substrate 58 makes it easier to use the film, which is then already coated with the supporting conducting material of the secondary conductor 58, as a component. In addition, the vias 62 shown in this example can have a different shape and count. In this example, it is believed that two vias 62 are enough to support any cracks because the first primary electrode layer 56a provides high conductivity to the strip between the vias 62. It is also believed that, in case of a crack in that area in the first primary electrode layer 56a or the second primary electrode layer 56b, the supporting layer of secondary electrodes 58 layer will bridge a gap created by such a crack.

Figure 8:
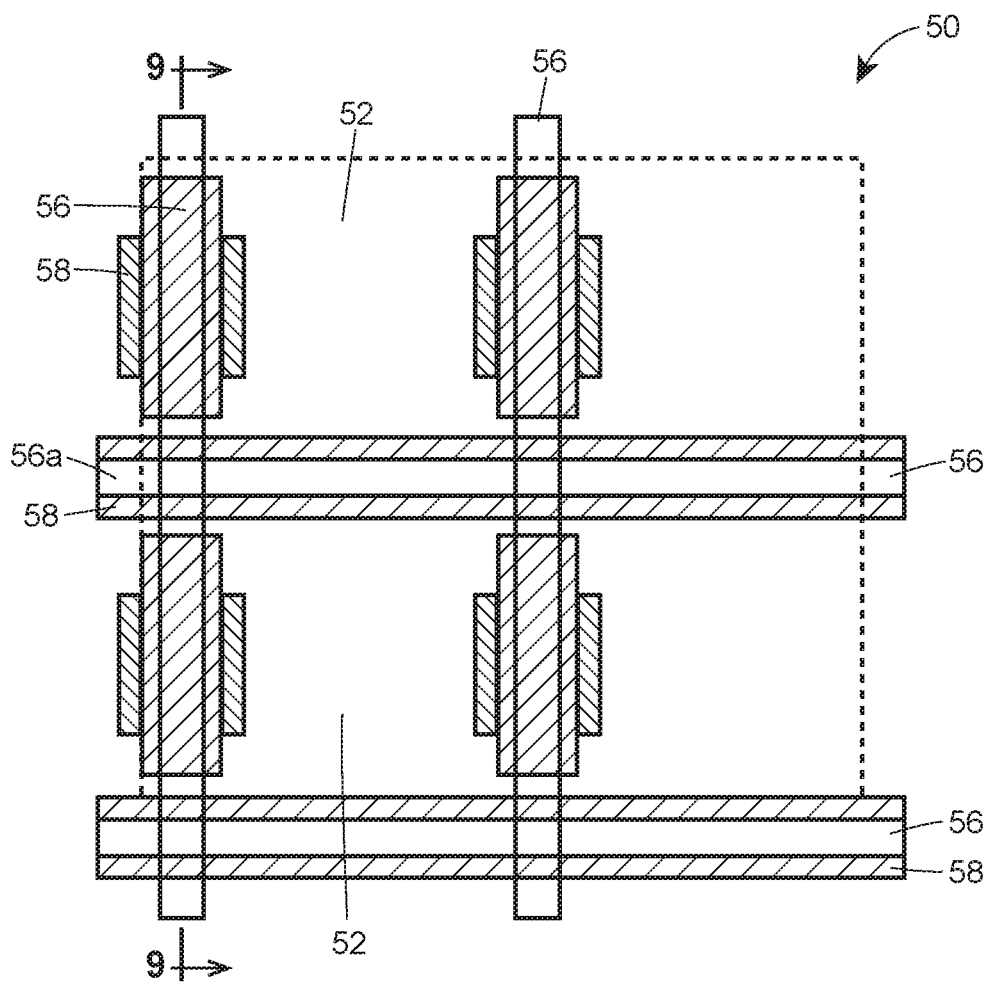
FIG. 8 is a diagrammatic top plan view of a portion of an electronic circuit device according to another aspect of the present disclosure
Figure 9:
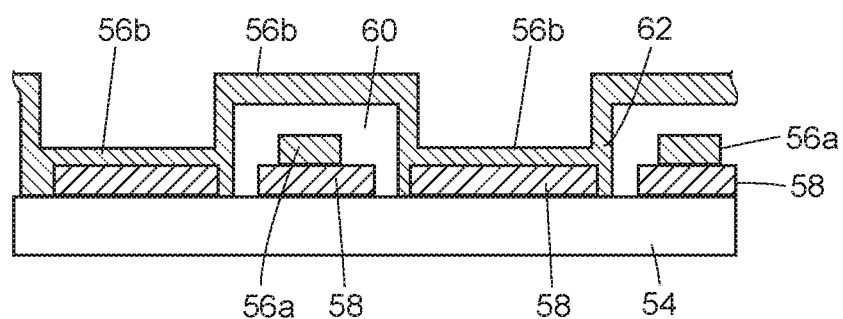
FIG. 9 is a diagrammatic cross-section view of the layer stack of the electronic circuit device along the lines 9-9 of FIG. 8.

FIGS. 8 and 9 illustrate a portion of an electronic display 50 exemplifying certain additional aspects of the disclosure. Features with the same reference numbers as used previously have the same characteristics described previously, except as otherwise described hereinafter or shown in the drawings. In this arrangement, the secondary electrodes 58 are patterned separately from the first primary electrode layers 56a. For example, the secondary electrodes 58 may be formed from a layer of the secondary conductor above by coarse patterning using laser ablation. The secondary electrode 58 may then be a component on which the rest of the layers stacked on top of it are subsequently processed and patterned.

In this arrangement, the secondary electrodes 58 may optionally have a certain larger alignment tolerance in order to assure that possible film deformation or baking steps before the rest of the stack is processed does not result in misalignment of the support layer formed by the secondary electrode 58 with the traces of rest of the stack. Thus, as illustrated in FIG. 8, the secondary electrodes 58 form traces that are wider than the corresponding traces of the first primary electrode layer 56a, which is disposed directly on top of the secondary electrodes 58. Of course, in other embodiments, the traces of the first primary electrodes 56 may be the same width or may be wider (on the support substrate) than the traces of the secondary electrodes 58.

In this exemplary arrangement, the second primary electrode layer 56b is in direct contact with the secondary electrode 58 as much as possible between the crossings of the rows and columns, because the first primary electrode layer 56a is not present in that area. However, in some arrangements the metal of the first primary electrode layer 56a could also be present at these crossings when it is not removed, in which case the first and second primary electrode layers 56a and 56b would both be on top of the secondary electrode 58. These design variations can also be used in the exemplary arrangement of FIGS. 6 and 7. Generally speaking, the dielectric layer 60 is present everywhere over the circuit and the support substrate 54 except at the positions of the vias 62, where a portion of the dielectric layer is removed to facilitate the contact between the conducting layers 58/56a and the conducting layer 56b. In contrast to the arrangement of FIGS. 6 and 7, where small via holes are made in the dielectric, in this arrangement a bigger part of the dielectric 60 (indicated by the rectangle on top of the supporting electrode patches 58) is to be removed. In this manner, the second primary electrode layer 56b is in contact with the supporting electrode over the complete length of the patch. In this arrangement, the first layer 56a of the primary electrode 56 forms the rows and the second layer 56b of the primary electrodes forms the columns, while the dielectric 60 electrically isolates the rows from the columns. The secondary electrodes 58 extend along a first trace, including the entirety of the rows and portions of the columns between the rows. The second layer 56b of the primary electrode 56 extends along a second trace that forms the columns, which is different than the first trace.

Figure 10:
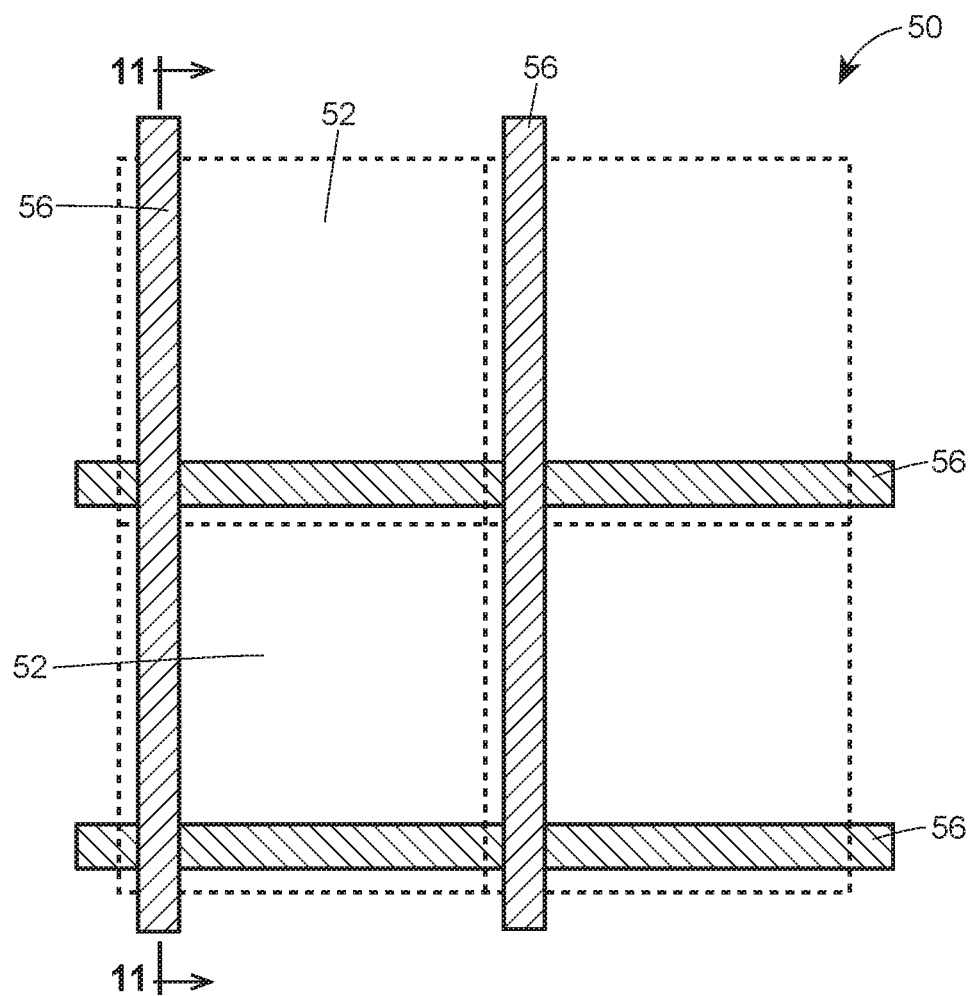
FIG. 10 is a diagrammatic top plan view of a portion of an electronic circuit device according to a further aspect of the present disclosure
Figure 11:
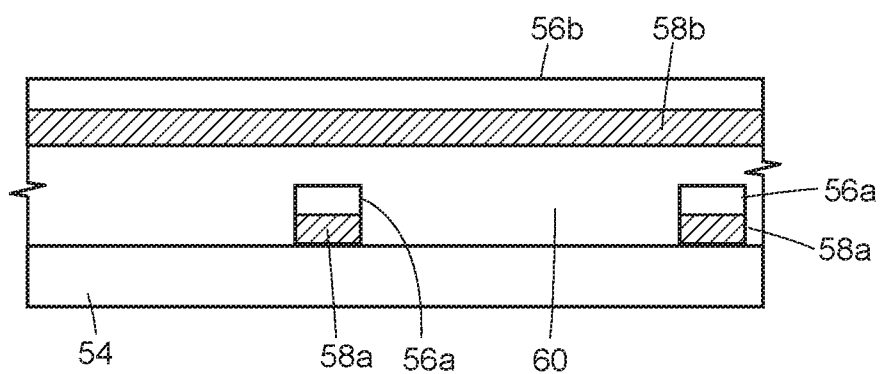
FIG. 11 is a diagrammatic cross-section view of the layer stack of the electronic circuit device along the lines 11-11 of FIG. 10.

FIGS. 10 and 11 illustrate a portion of an electronic display 50 exemplifying certain additional aspects of the disclosure. Features with the same reference numbers as used previously have the same characteristics described previously, except as otherwise described hereinafter or shown in the drawings. In this arrangement, two layers 58a and 58b of secondary electrode 58 are used, one layer for each of the first primary electrode layer 56a and the second primary electrode layer 56b. The first secondary electrode layer 58a is disposed directly underneath the first primary electrode layer 56a. Preferably, the first secondary electrode layer 58a follows the identical trace as the first primary electrode layer 56a. Similarly, the second secondary electrode layer 58b is disposed directly underneath the second primary electrode layer 56b. Preferably, the second secondary electrode layer 58b follows the identical trace as the second primary electrode layer 56b. The first layer 56a of the primary electrodes 56a forms one or more row electrodes and, the second layer 56b of the primary electrode 56 forms one or more column electrodes. An advantage of this configuration is that a supporting secondary electrode 58 is present for each of the first and second primary electrode layers 56a, 56b in the crossings between the row electrodes and the column electrodes. However, additional processing steps may also be required to form the second layer 58b of the secondary electrode 58.

The secondary electrode layers 58a and 58b may be disposed at any position in the pixel stack. Thus, the secondary electrode layers 58a, 58b may be located underneath the respective first and second primary electrode layers 56a, 56b, forming a supporting layer as illustrated in the drawings, and/or may be located on top of one or both of the primary electrode layers 56a, 56b. However, it is believed that it may be most advantageous if the secondary electrode and the primary electrode layers are directly above or below one another with respect to mitigating the effect cracks caused by impacts and bending.

The disclosure is not limited to the exact arrangements depicted in FIGS. 6-11, but rather different combinations of individual features of each exemplary arrangement is also contemplated. For example, the teachings of the exemplary arrangement of FIGS. 10 and 11 can be optionally combined with the exemplary arrangement of FIGS. 6 and 7 by only using the second secondary electrode layer 58b in the area of crossings of the rows and the columns, while using the first secondary electrode layer 58a everywhere else. In addition, the disclosure is not limited to pixel stacks with only two layers of primary electrodes 56a and 56b as shown in the exemplary arrangements of FIGS. 6-11, but rather can be extended to pixel stacks with more than two layers of the primary electrodes 56.

There are many different higher strain limit, electrically conductive materials that can handle more strain than conventional metals such as gold, silver, or copper. Following are some non-limiting examples of some electrically conductive materials with comparatively high strain limits that are considered suitable for use as the secondary electrode 58 in any of the exemplary arrangements described herein. However, other materials that provide similar electrical conductivity and strain functionalities could also be used.

One material suitable for use to form the secondary conductors 58 is a film that includes carbon nanotubes. Carbon nanotube films are well known in the art, and there are several suppliers of carbon nanotube films, for example, Cantu, Unidym, Eikos, and Nanobit. Generally, these films have random networks of carbon nanotubes that create a continuous conducting film when the concentration of carbon nanotubes is above the percolation threshold. The carbon nanotubes themselves are usually black. However, because of the large aspect ratio of the carbon nanotubes, a low concentration of carbon nanotubes is usually enough to form a continuous conducting film. This results in a film with high transparency suitable for an electronic display. Typical conductance values of such films are in the range of 1 kOhm/square to 100 Ohm/square. As these networks of carbon nanotubes are not a continuous solid layer, they can be extremely flexible and can bend without cracking. These materials can also handle a large amount of strain without significant change in resistance. An advantage of carbon nanotube films is that they can be patterned either by laser ablation at resolutions as small as 30 micron or by conventional photolithography.

Another material suitable for use to form the secondary conductors 58 is films and/or layers of silver nanowires and/or copper nanowires. Silver nanowires and film with silver nanowires are also well known and produced by several companies, for example, Cambrios, Carestream, Innova Dynamics, and BASF. The properties of silver nanowire films are very similar to the carbon nanotubes films in that they have random networks of flexible rods of silver that do not crack easily. The electrical conductivity can be varied by varying the density of the silver nanotubes in the layer. The conductance of a silver nanowire film can be as low as 5 Ohm/square, and the film can typically handle a high amount of strain without significant increase in resistance. Copper has also been used as a material to make conductive nanowires, and such films and/or layers also may be suitable for the secondary conductors 58.

Another material suitable for use to form the secondary conductors 58 includes organic conducting polymers. There are a number of intrinsically electrically conductive polymers that are commonly used in electronic products. One such polymer believed to be well suited for application as the secondary conductors 58 includes PeDot (poly(3,4-ethylenedioxythiophene) polystyrene sulfonate). Advantages of using such organic conducting polymers include that they typically can be easily coated as a layer on a substrate and can handle strains up to 8% due to the organic nature of the materials. The conductivity of these films is generally dependent on the thickness of the layer. For most practical applications relative to use in electronic displays, the conductivity of organic conducting polymers is typically in the range of 50 to 1000 Ohms/square.

Typically, none of these electrically conductive materials would be used as primary electrodes in a typical electronic display, such as an LED or LCD display, because the conductivity is too low to provide optimal functionality of the display. For example, the typical requirement for a primary electrode 56 in an LED display is to have a resistance that is on the order of 2 Ohms/square or lower. The electrically conductive materials described above for forming the secondary conductors 58, however, are typically at least an order of magnitude higher in resistance in practical applications. Nevertheless, these electrically conductive materials are well suited for use as the secondary conductors 58 in the manner described herein.

Figure 12:
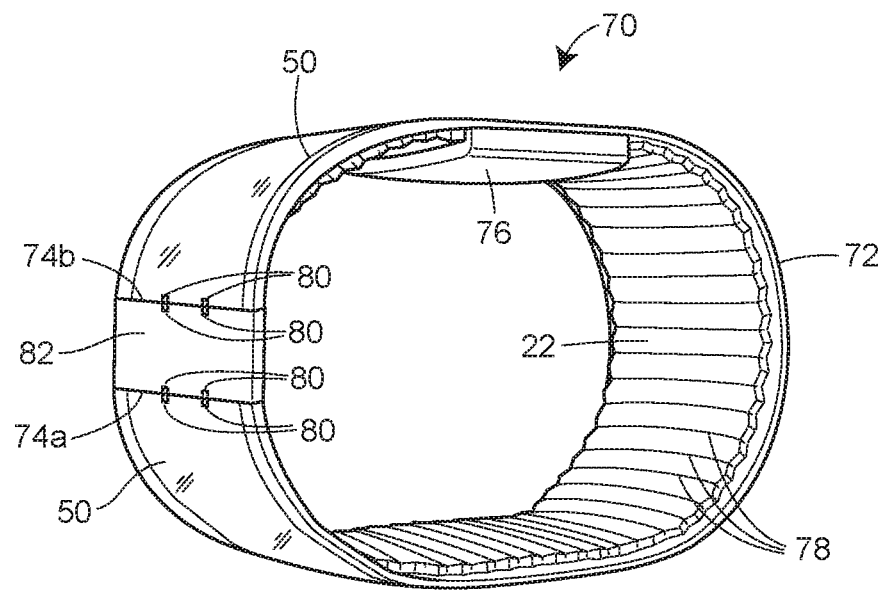
FIG. 12 illustrates a dynamically flexible electronic display device according to some aspects of the disclosure in the form of a wrist band device including an extender that increases a length of the device and connects the ends of the wristband device together in an end-to-end manner so as to provide maximal continuous display surface to a user when wearing the band.
Figure 13:
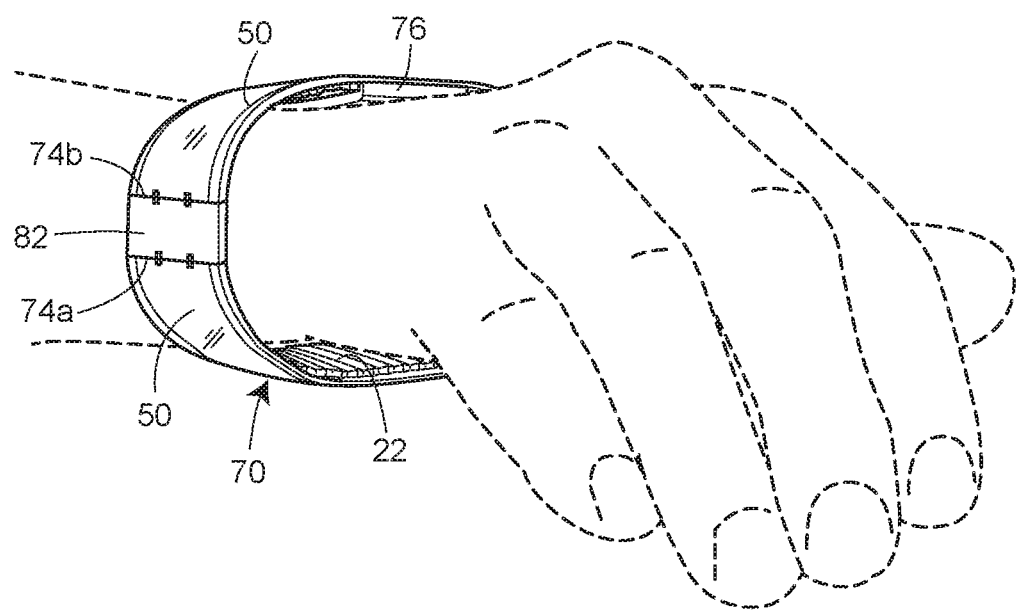
FIG. 13 illustrates the band of FIG. 12 when connected around a user's wrist.
Figure 14:
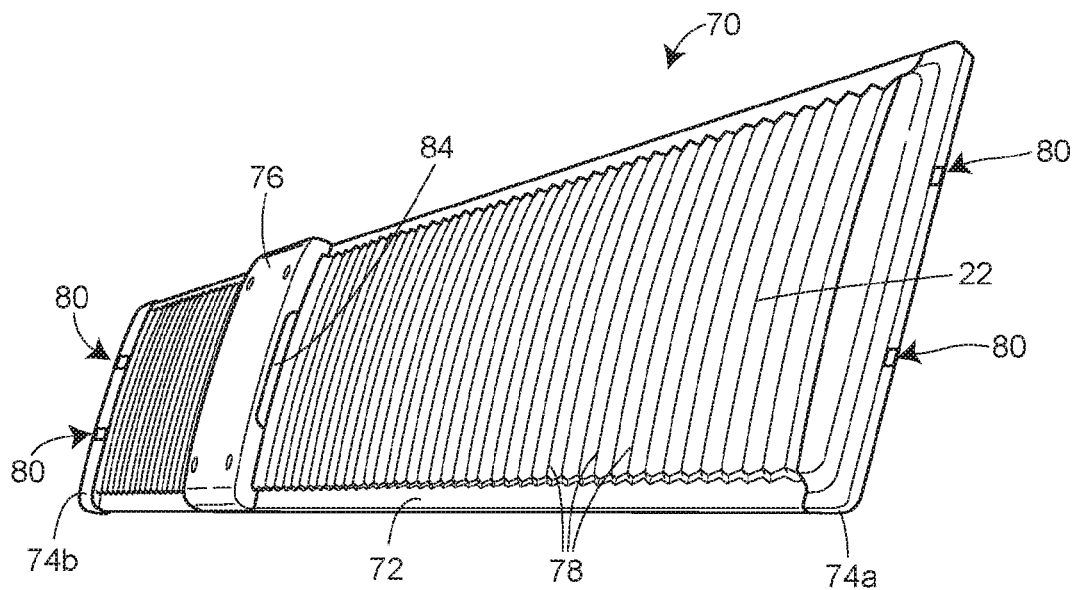
FIG. 14 is a perspective view of the band of FIG. 12 laid out in a flat configuration.

Any one of the electronic displays 50 may be implemented as part of many different and various types of displays. In particular, where the bottom substrate 54 is a flexible substrate, the electronic displays 50 may be dynamically flexible, attachable, and/or incorporated into wearable articles or devices. FIGS. 12, 13, and 14 illustrate an embodiment of a dynamically flexible, attachable and/or wearable device 70, which in this example is in the form of a wrist band device, which incorporates a dynamically flexible electronic display 50 as described previously herein, in which the support substrate 54 is formed of a dynamically flexible material, and adapted to be worn on the wrist of a person. The device 70 may, for example, provide telephone, computer, and/or time showing functionalities, and/or other functionalities that would benefit from having an electronic display 50 for displaying changeable information to a user. In some arrangements, the electronic display 50 may be a touch screen that allows input of commands and/or information by touching various areas of the visual display area of the electronic display.

The wrist band device 70 includes a flexible band portion 72, which is generally rectangular in shape and configuration, disposed between two ends, end pieces, or fasteners 74a, 74b. The band portion 72 can be configured to be stiff enough such that the band 72 can retain its shape when bent (i.e., the band 12 is not floppy). The band portion 72 includes a foam layer that forms a flexible support substrate 22 for the flexible electronic display 50. The foam layer is disposed on the back side of the electronic display 50 such that the electronic display 50 is viewable from the top (i.e., the outside of the band 72 when curved as shown in the figures) of the band 72.

An electronics module 76 having an exterior casing or cover is disposed on the band 72 at a position between the two end pieces 74a and 74b. The electronics module 76 controls the functioning of the electronic display 50. Preferably, the electronics module 76 is not centered between the two end pieces 54a and 54b, but rather is disposed closer to one end piece 74b than the other end piece 74a. The electronic display 50 extends between and preferably to each of the two end pieces 74a and 74b. The electronics module 76 (or the cover associated with that module) may act as a reference mark or reference location that is to be placed at a particular position on a user's wrist, in this case, on the top of a user's wrist. The electronics module 76 or the cover associated with the module is optionally contoured or curved to better match the contour of a wearer's wrist but could alternatively be flat.

As best illustrated in FIGS. 12 and 14, a plurality of grooves 78 are formed (e.g., molded) in an underside (i.e., the rear side) of the flexible support substrate 22. The grooves 78 extend in the width direction across the band 72 from one side of the band 72 to the opposite side of the band 72 (i.e., oriented transversely). Each groove 78 extends through only a portion of the thickness of the foam layer such that the flexible support substrate 22 includes a continuous layer of foam material immediately adjacent an underside of the flexible electronic display 50 and a plurality of sections or islands that jut or extend upward from the bottom layer between adjacent respective grooves 78. The grooves 78 can, when the band 72 is being bent, control the amount of bending between the sections of the flexible support substrate 22, and, in turn, control the amount of bending applied to the flexible electronic display 50. The size, number, spacing and/or compressibility of the foam material and the grooves 78 may be varied to define, and thus limit, the amount of torsional or other bending motion that can be applied to the flexible support substrate 22.

One or both of the end pieces or clasps 74a, 74b may include a connection structure therein that functions to connect the end pieces 74a, 74b together when the band portion 72 is bent, as illustrated in FIGS. 12 and 13, to form a circular or oval band. The two end pieces 74a and 74b are arranged to provide an end-to-end connection, wherein the end of the end piece 74a couples to the end of the end piece 74b without an overlap. The connection structure may be in the form of magnetic materials 80 disposed in or on each of end pieces 74a, 74b, wherein the magnet materials 80 operate, when in close proximity to one another, to hold the end pieces clasps 74a, 74b together. The magnetic materials 80 can each be a permanent magnet, or one of the materials 80 can be a permanent magnet while the other material 80 can be a magnetically permeable material, such as many kinds of metal. The magnetic materials 80 can be disposed at the longitudinal ends of the end pieces 74a, 74b so that the end pieces 74a, 74b connect end-to-end when the band 72 is bent. In some arrangements, the end pieces 74a and 74b may include complementary sets of magnetic connectors 80 used in conjunction with a mechanical connector, to effect a clasping structure in a fixed length band 72. Preferably, the end pieces 74a and 74b can be mechanically and magnetically connected to one another in an end-to-end connection when the wrist band device 70 is bent, as illustrated in 12 and 13, to form a circular or oval wrist band. Various combinations and arrangements of magnetic connectors 80 and/or mechanical connectors may be used to enable easy coupling and decoupling of the opposite ends of the band 72 in an operable manner to the user's wrist.

Optionally, one or more extenders 82 can be removably coupled to one or both of the first and second end pieces 74a, 74b of the band 72 to adjust the length of the band 72 and/or to add or increase functionality to the device 70. Preferably, the extender(s) 82 have complementary clasping mechanisms to the clasping mechanisms 80 in each of the end pieces 74a, 74b such that one or more extenders 80 can be removably coupled to one or both of the end pieces 74a, 74b and/or to one another. Thus, for example, the extender 82 may have magnets 80 on opposite ends and/or a tab on one end and a recess on the other end complementary to the clasping mechanisms of the end pieces 74a, 74b. It will be understood that any number of extenders 82 can be used, depending on the desired length of the band 72 and/or the desired functionality.

As illustrated by a user's wrist in dotted relief in FIG. 13, the position of the extender 82 corresponds (e.g., is adjacent) to the outer side of the user's wrist. As such, the flexible electronic display 50 forms a continuous electronic display that extends across the entire top of the wrist, through the inner side of the wrist, to the bottom of the wrist. This continuous usable display enables a user to view a long continuous screen or multiple serial display screens disposed next to one another on the flexible display 50 without there being any discontinuity in the display of these screens, as the user turns his or her wrist between a palm up and a palm down position or vice versa.

FIG. 14 illustrates the back of the wrist band device 70 of FIGS. 13 and 14, when the band 72 is laid out flat or straight. The electronics module 76 sticks away from the rear surface of the band 72 and thus provides a tactile sensation to the user when the user wears the wrist band device 70. This feature, in turn, makes using the module 76 as the reference point for the user when placing the band on the user's wrist more natural, as the user can feel the presence of the module 76 in the correct location on the top (or bottom) of his or her wrist, and thus will know that the band 72 is properly aligned on the wrist to provide for a maximal continuous usable display surface in the manner described above. Still further, as illustrated in FIG. 14, the electronics module 40 may have one or more contact points 84 that for charging a battery (not shown) disposed within the electronics module 76 and/or to provide electronic communications between the electronics module 76 and another device, such as a base station or a base unit.

Figure 15:
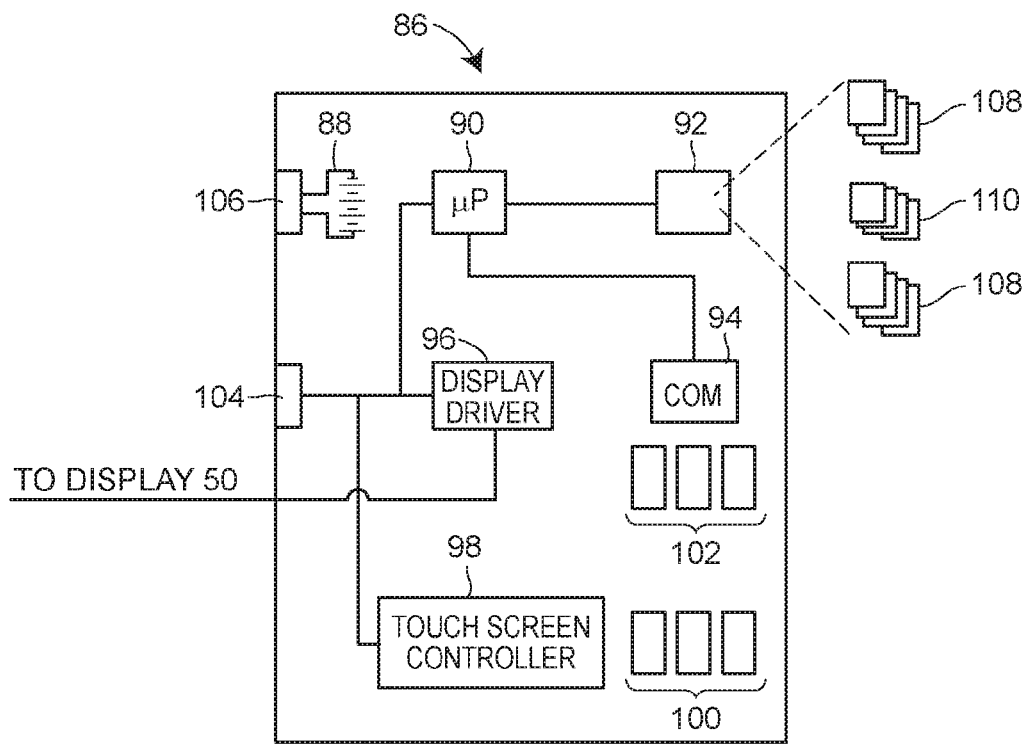
FIG. 15 is a block diagram of an electronics control module associated with the devices described herein.

FIG. 15 illustrates a block diagram of various electronic components, referred to herein as an electronics suite 86, that may be used in or disposed in the electronics module 76 to drive the flexible electronic display 50. The electronics suite 86 includes a battery 88 that powers a number of other modules or electronic components, including a microprocessor or other processor 90, a computer readable memory 92, which may be, for example, a flash memory or other suitable type of non-transitory, tangible, data storage medium, a communication module 94, a display driver 96, a touch screen controller 98 and a number of sensors 100 and other secondary devices 102.

The sensors 100 may include, for example, any number of any number of types of sensors, such as strain gauges, gyroscopes, accelerometers, compression sensors, tensional strain sensors, positional sensors, motion or movement sensors, pressure sensors, vibration sensors, temperature sensors, orientation sensors, gravity sensors, light sensors, and piezoelectric sensors, to name a few. The secondary electronic devices 102 may include, for example, an alarm or noise creation device, a speaker, a microphone, a vibrator the operation of which causes the clasp 54a, 54b or electronics module 40 to vibrate, etc. The sensors 100 and the secondary electronic devices 102 may be integral with the electronics suite 70 and/or one or more of the sensors 100 and/or the secondary electronic devices 102 may be physically disposed at one or more other locations along the band 72 separate from the remainder of the electronics suite 86. In any case, the sensors 100 and the secondary electronic devices 102 remain in communicative connection with the remainder of the electronics suite 86, for example, via a wired or wireless connection). The sensors 100 may include touch sensors that allow the electronic display 50 to have touch screen functional capabilities.

The memory 92, the communication module 94, the display driver 96, and the touch screen controller 98, as well as the sensors 100 and other secondary electronic devices 102, are communicatively connected to the processor 90 and may operate to perform various functions in conjunction with applications or other programs implemented by the processor 90, in any manner understood in the art. Still further, each of these elements is connected to and is powered by the battery 88 in any known or desired manner. In addition, the electronics suite 86 may include one or more communication ports, such as communication port 104 (e.g., a USB or other type of digital communication port) and a power or battery charger input port 106. The power input port 106 is connected to the battery 88 and enables charging or recharging of the battery 88 using any known or desired recharging circuitry and methodology. Alternatively or in addition, the communications input port 104 (in the form of for example, a USB input port) may be connected to the battery 88 and provide power for charging battery 88, and the input port 104 may also be connected to the microprocessor 90, as well as to the communication circuit module 94, for performing wired-based communications via the input port 104. Additionally or alternatively, the input port 104 may include a wireless input port for performing wireless communications. The power input port 106 may be a wireless input port for powering the device 70, for example, a battery charger unit that operates to charge the battery 88 using an inductively coupled charging technique.

The processor 90, which may be a programmable, general-purpose processor or a specially programmed processor programmed using any desired type of hardware or firmware programming, generally coordinates and implements the operation of the flexible display 50 and the associated electronic components as described in more detail herein. The computer readable memory 92 stores various applications, including for example the general operating system implemented by the processor 90, and various applications 108 to be run on the processor 90 to implement various different types of functionality via the device 70. The memory 92 may also store one or more data files 110, which may be, for example, image or video data files associated with various images to be displayed on the display screen 50 at various different times. The microprocessor 90 or one of the secondary electronic components 102 may include or be a clock that tracks the current time, day, date, month, year, time zone, etc.

The communication module 94 may include or use any type of communication hardware/software/firmware that uses any desired types of communication techniques to enable the microprocessor 90 to communicate with exterior devices or sources. For example, the communication module 94 may be a wired or wireless Internet-based communication module that may provide wired or wireless-based, IP protocol communications between the device 70, and other devices or a communication network such as a LAN or a WAN to which other devices are communicatively connected. Likewise, the communication module 94 may include a near field communications (NFC) module, a radio frequency identification (RFID) communications module for communicating with RFID tags stored in other devices around or close to the device 70, a Bluetooth communication module, and so on. Still further, the communications module 94 may include a USB or other type of wired communication module for decoding and encoding USB-based communication signals to be sent out and received via the USB communication port 104.

The display driver 96 is coupled to the microprocessor 90 and to the flexible electronic display 50, and drives the flexible electronic display 50 to present different images to a user and thus implement functionality via the flexible electronic display 50. The display driver 96 may be associated with or use any type of display driver technology associated with the various different types of flexible displays that might be used, including, for example, e-ink or other bi-stable display drivers, organic light emitting diode (OLED) display drivers, electrophoretic, e-paper, etc. The display driver 96 is connected to the various pixel elements or pixels 52 of the flexible display 50 by means of the primary electrodes 56, for example, via the row electrodes and the column electrodes, to cause the pixel elements to change their visual appearance so as to present content image on the flexible display 50 in any manner well understood in the art, the details of which are not repeated here for brevity.

In an optional arrangement, the touch screen controller 98 is connected to a touch screen interface (e.g., the touch screen 25) if such an interface exists, and receives input signals from the touch screen interface. The controller 98 operates to decode these input signals to identify touch events that occur with respect to the touch screen interface in any manner understood in the art. Any types of touch screen interfaces suitable for use with the flexible electronic display 50 may be used.

The sensors 100 may include one or more gyroscopes which detect movement of or the orientation of the band 72. The output of such gyroscopes can be used by the microprocessor 90 to determine the orientation or direction of the flexible display 50 to enable the microprocessor 90, or an application 108 executed on the microprocessor 90, to determine the proper orientation of the image to be displayed on the flexible display 50. In some instances, devices might be located so as to be able to determine whether the device 70 is oriented around a wrist or other circular member or whether it is instead laid out flat or oriented in some other manner. The microprocessor 90 or an application 108 executed thereon may change functionality, behavior, and/or actions of the device 70 based on the detected orientation of the band 72.

In some cases, the sensors 100 include one or more pressure or force sensors and/or strain gauges which detect pressure, strain, or similar forces that are considered to be an input to cause the functionality, behavior, and/or actions of the device 70 to change, e.g., reset the device 70, change a mode of the device 70, change a presentation displayed on the flexible display 50 of the device 70, etc. In one example, two pressure or force sensors are positioned on or attached to the band 72 (e.g., as part of the backplane of the flexible display 50 or as part of the flexible support substrate 22 so that when the device 70 is attached to itself in a generally circular or looped configuration, the pressure or force sensors are diametrically opposed to each other.

The example device 70 of FIGS. 12-14 is only exemplary arrangement, it being understood that the electronic display 50 may be used in an almost infinite number of different forms and/or applications. Thus, the disclosure is not limited to implementing the electronic display 50 in the device 70, but rather may be implemented in any functionally compatible device as desired.

Although the examples described in detail are directed generally to electronic displays, the features and arrangements may be used for other flexible electronics more generally, such as, flexible circuits, flexible displays, flexible solar cells, flexible OLET lighting, and so on. The teachings of the present application may be applied to active-matrix displays, passive-matrix displays, and segmented displays and lights. In addition, although the embodiments using two crossing traces have been described as showing an electronic display, it is understood that the same teachings are also applicable to any circuit in general (e.g., circuit, image sensor, etc.) that has crossings similar to those described above and/or that can be made in the same or a similar manner as that illustrated in the embodiments of the figures provided herein. Thus, the exemplary arrangement shown in the drawings and described in detail herein are not intended to be limiting of the invention, but rather a provided as just one example out of many possible arrangements to enable the person of ordinary skill to make and use the invention. Additional arrangements, combinations of features, and/or advantages of the invention are contemplated within the scope of the claims appended hereto.

What is claimed:

1. An electronic circuit device, comprising:
   a plurality of electrical circuits disposed on a support substrate;
   at least one primary electrode extending along a trace on the support substrate, wherein the primary electrode forms a primary electrical pathway of at least one of the electrical circuits; and
   a secondary electrode disposed along and in electrical contact with the primary electrode, wherein the secondary electrode extends along the trace substantially parallel with the primary electrode and forms a secondary electrical pathway adjacent the primary electrical pathway;
   wherein the secondary electrode is formed of a secondary conductor that is electrically conductive and has a higher strain limit than the primary electrode, and
   wherein the secondary electrode handles a higher amount of strain than the primary electrode without breaking the secondary electrical pathway and thereby completes the electrical circuit when a gap in the primary electrode interrupts the electrical circuit through the primary electrode.

2. The electronic circuit device of claim 1, wherein the secondary electrode has a lower electrical conductivity than the primary electrode.

3. The electronic circuit device of claim 1, wherein the secondary electrode is disposed directly underneath the primary electrode and forms a supporting layer for the primary electrode.

4. The electronic circuit device of claim 1, wherein the secondary electrode is positioned on top of the primary electrode.

5. The electronic circuit device of claim 1, wherein the secondary electrode is positioned between an upper layer of the primary conductor and a lower layer of the primary conductor.

6. The electronic circuit device of claim 1, wherein the secondary electrode has a different pattern on the bottom substrate as the primary conductor.

7. The electronic circuit device of claim 1, wherein the secondary electrode and the primary electrode each have the same width on the substrate.

8. The electronic circuit device of claim 1, wherein the secondary electrode is wider on the bottom substrate than the primary electrode.

9. The electronic circuit device of claim 1, wherein the secondary electrode is narrower on the bottom substrate than the primary electrode.

10. The electronic circuit device of claim 1, wherein the primary electrode comprises a first layer and a second layer, wherein the first layer of the primary electrode is disposed on top of the secondary electrode, the second layer of the primary electrode is disposed above the first layer, and a dielectric layer is disposed between the first layer and the second layer along portions of the electrical circuit.

11. The electronic circuit device of claim 10, wherein the first layer of the primary electrode forms one of row electrodes and column electrodes, and the second layer of the primary electrode forms the other of row electrodes and column electrodes.

12. The electronic circuit device of claim 10, wherein each of the first layer of the primary electrode and the first layer of the secondary electrode extends along a first trace, and wherein the second layer of the primary electrode extends along a second trace that is different than the first trace.

13. The electronic circuit device claim 12, wherein the secondary electrode comprises a first layer and a second layer, the first layer of the primary electrode is disposed on top of the first layer of the secondary electrode, and the second layer of the primary electrode is disposed on top of the second layer of the secondary electrode.

14. The electronic circuit device claim 12, wherein the secondary electrode comprises a first layer and a second layer, the first layer of the secondary electrode is disposed on top of the first layer of the primary electrode, and the second layer of the secondary electrode is disposed on top of the second layer of the primary electrode.

15. The electronic circuit device of claim 14, wherein each of the second layer of the primary electrode and the second layer of the secondary electrode extends along the second trace.

16. The electronic circuit device of claim 1, wherein the secondary conductor has the form of a film comprising one or more of carbon nanotubes, silver nanotubes, silver nanowires, copper nanowires, and conductive organic polymers with high strain limit and/or ductility.

17. The electronic circuit device of claim 1, wherein the plurality of electrical circuits comprise a matrix of pixels of an electronic display device.

18. The electronic circuit device of claim 17, wherein the electronic display device comprises at least one of a liquid crystal display, OLED, electrophoretic, E-Ink, and e-paper display.

19. The electronic circuit device of claim 17, wherein the matrix of pixels is carried by a dynamically flexible substrate.

20. A wrist band device comprising:
    a flexible band to be secured around a user's wrist;
    the electronic circuit device of claim 19 carried by the flexible band and disposed on an outer side of the flexible band; and
    an electronics module carried by the flexible band, wherein the electronics module controls functioning of the electronic display device.

* * * * *